United States Patent [19]

Kaneko

[11] Patent Number: 5,177,527
[45] Date of Patent: Jan. 5, 1993

[54] IMAGE FORMING APPARATUS

[75] Inventor: Hidetoshi Kaneko, Nara, Japan

[73] Assignee: Sharp Kabushiki Kaisha, Osaka, Japan

[21] Appl. No.: 631,718

[22] Filed: Dec. 21, 1990

[30] Foreign Application Priority Data

Dec. 28, 1989 [JP] Japan .................... 1-344225

[51] Int. Cl.⁵ .................... G03B 27/52
[52] U.S. Cl. .................... 355/27
[58] Field of Search .................... 355/27, 28, 100, 106

[56] References Cited

U.S. PATENT DOCUMENTS 4,977,437 12/1990 Asai et al. .................... 355/27
5,017,958 5/1991 Katoh .................... 355/27

FOREIGN PATENT DOCUMENTS 0261509 3/1988 European Pat. Off. .
0263609 4/1988 European Pat. Off. .
0333481 9/1989 European Pat. Off. .
63-197948 8/1988 Japan .

OTHER PUBLICATIONS

EPO Search Report No. 90125688.3 dated Feb. 25, 1992.

Primary Examiner—Michael L. Gellner
Assistant Examiner—D. Rutledge
Attorney, Agent, or Firm—David G. Conlin; Robert F. O'Connell

[57] ABSTRACT

An image forming apparatus in which a photosensitive sheet and an image receiving sheet are pressed together while being transported by a pressure developing device, the image receiving sheet being then separated from the photosensitive sheet by a separation roller. The pressure developing device continues to transport the photosensitive sheet after the image receiving sheet is separated therefrom, and the transportation of the photosensitive sheet by the pressure developing device is stopped when the trailing edge of the image receiving sheet has passed the separation roller.

5 Claims, 3 Drawing Sheets

IMAGE FORMING APPARATUS

BACKGROUND OF THE INVENTION

1. Field of the Invention

The present invention relates generally to an image forming apparatus in which a photosensitive sheet coated with light and pressure sensitive microcapsules containing photohardening materials and coloring dyes is superimposed and pressed on an image receiving sheet coated with a developer that reacts with the coloring dyes to develop colors, thereby forming an image, and more particularly to an image forming apparatus including a sheet transport device for transporting the photosensitive sheet and the image receiving sheet.

2. Description of the Prior Art

When a photosensitive sheet coated with light and pressure sensitive microcapsules containing photohardening materials and coloring dyes is exposed to light reflected from a document or any other object, the microcapsules exposed to the light harden to form a latent image. On the latent image, an image receiving sheet coated with developer that reacts with the coloring dyes contained in the microcapsules is superimposed and pressed together, thereby causing unhardened microcapsules to rupture and the coloring dyes contained therein to flow out onto the image receiving sheet, to develop the latent image. After such a pressure developing process, the two sheets are separated from each other at a separation section, and the photosensitive sheet is taken up on a takeup shaft, while the image receiving sheet is transported, for example, by means of a transport roller, to a glosser unit where it is treated with heat.

Normally, when the pressure developing process is completed, the leading edge of the image receiving sheet has reached the glosser unit, or at least as far as the transport roller. Since the leading edge of the image receiving sheet separated from the photosensitive sheet is pulled by the glosser unit or by the transport roller to further transport the image receiving sheet, transportation of the photosensitive sheet is stopped upon completion of the pressure developing process.

However, when the image receiving sheet is thus transported while transportation of the photosensitive sheet is stopped upon completion of the pressure developing process, since the portion of the image receiving sheet which is not separated from the photosensitive sheet drags along the photosensitive sheet, there is a possibility that the image formed on the image receiving sheet may be smeared. Also, since the image receiving sheet is transported dragging along the photosensitive sheet, transportation of the image receiving sheet by the transport roller, etc. may become unstable, and the image receiving sheet may not be completely separated from the photosensitive sheet. Furthermore, with the extra load applied to the image receiving sheet, transport failure may result or wrinkles may be formed in the image receiving sheet.

Accordingly, it is an objective of the present invention to provide a sheet transport control device by which the image receiving sheet can be completely separated from the photosensitive sheet, thereby preventing the smearing, transport failure, etc. of the image receiving sheet.

SUMMARY OF THE INVENTION

The sheet transport device for an image forming apparatus of this invention, which overcomes the above-discussed and numerous other disadvantages and deficiencies of the prior art, comprises a pressure developing device for transporting a photosensitive sheet coated with light and pressure sensitive microcapsules containing photohardening materials and coloring dyes and an image receiving sheet coated with developer that reacts with the coloring dyes to develop colors, the two sheets superimposed one on top of the other for transportation, during which the two sheets are pressed together to form an image on the image receiving sheet; a separating means for separating the image receiving sheet that has passed the pressure developing device from the photosensitive sheet; an image receiving sheet sensor for detecting that the trailing edge of the image receiving sheet fed to the pressure developing device and to be separated from the photosensitive sheet by the separating means has passed a prescribed position; and a control means for performing control on the basis of the detection result of the image receiving sheet sensor so that the transportation of the photosensitive sheet is continued until the trailing edge of the image receiving sheet passes the separating means after passing the pressure developing device.

In a preferred embodiment, the photosensitive sheet is taken up by a takeup means after being separated from the image receiving sheet by means of the separating means, the transportation of the photosensitive sheet by the takeup means being controlled in the same manner as for the pressure developing means.

In a preferred embodiment, the sensor for sensing the trailing edge of the image receiving sheet is disposed forward of a resist roller provided to feed the image receiving sheet to the pressure developing device at a prescribed timing.

In a preferred embodiment, the control means controls the pressure developing device on the basis of the time elapsed after the image receiving sheet sensor has detected the trailing edge of the image receiving sheet.

In a preferred embodiment, the separating means is a separation roller for substantially altering the transporting direction of the photosensitive sheet in such a way as to move away from the image receiving sheet.

Thus, in the sheet transport device of the present invention, the image receiving sheet passed through the pressure developing device is transported together with the photosensitive sheet on to the separating means. After the image receiving sheet has been completely separated from the photosensitive sheet by the separating means, transportation of the photosensitive sheet by the pressure developing device is stopped. Therefore, there is no possibility that the image receiving sheet drags along the photosensitive sheet during transportation, thus assuring the image receiving sheet is free from transport failure, image smearing, wrinkling, and so on.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 4:
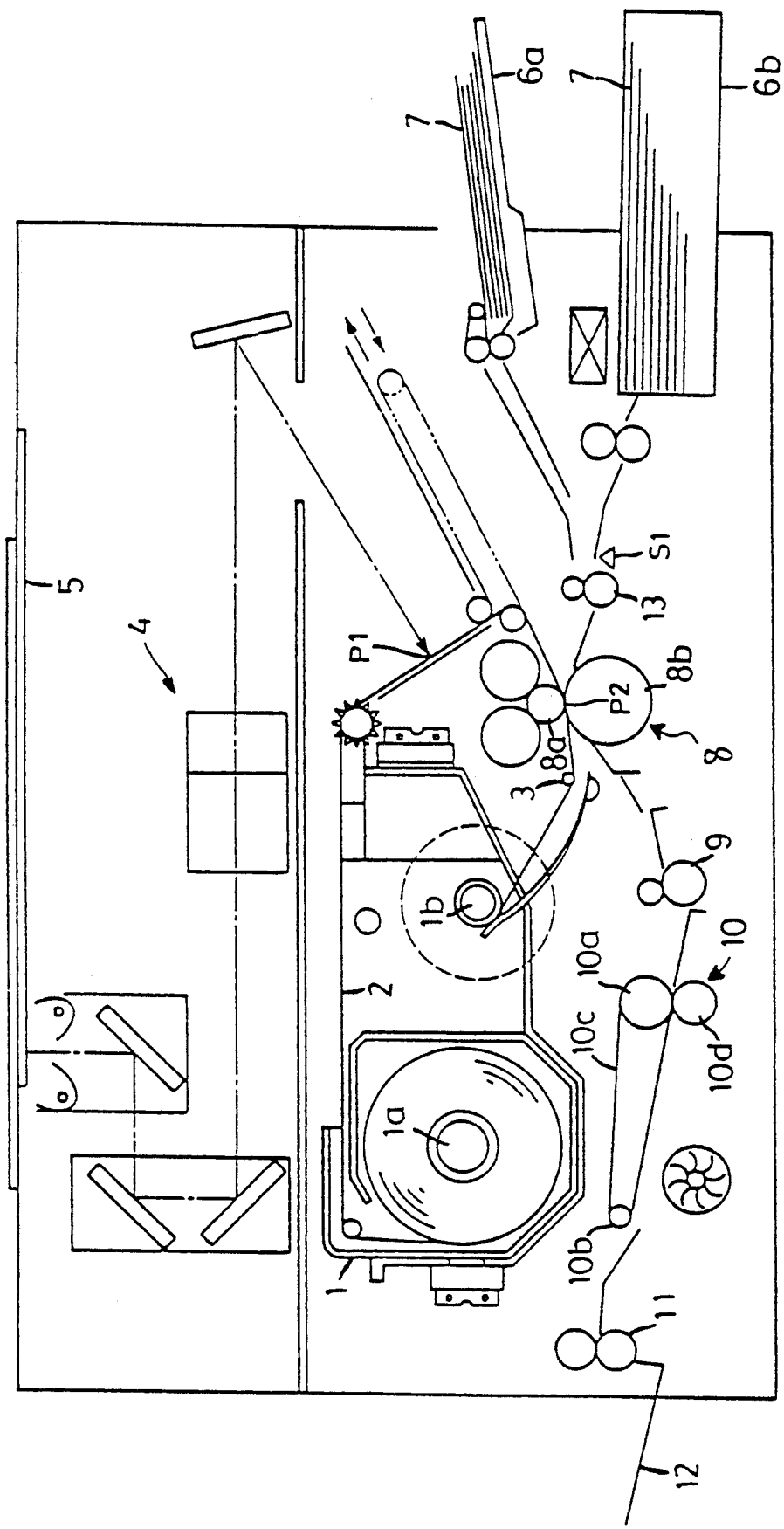
FIG. 4 is a schematic front view of a copying machine.

FIG. 4 is a schematic front view of a copying machine which forms an image using a photosensitive sheet and an image receiving sheet.

A photosensitive sheet cartridge 1 is detachably mounted on one side within the copying machine. The photosensitive sheet cartridge 1 is provided with a supply shaft 1a and a takeup shaft 1b, and a fresh photosensitive sheet 2 is rolled on the supply shaft 1a. The photosensitive sheet 2 housed in the photosensitive sheet cartridge 1 mounted in the copying machine is delivered from the supply shaft 1a toward the center portion of the copying machine.

In the upper part of the copying machine, there is disposed an optical system 4. The optical system 4 scans a document placed on a document table 5 and directs the reflected light therefrom to an exposure position P1 disposed adjacent to the center portion of the copying machine. The photosensitive sheet 2 drawn out of the photosensitive sheet cartridge 1 is passed through the exposure position P1 and then through a pressure developing position P2 on a pressure developing device 8 before being taken up onto the takeup shaft 1b in the photosensitive sheet cartridge 1. When it is passing the exposure position P1, the photosensitive sheet 2 is exposed to the light reflected from the document on the document table 5 by means of the optical system 4 disposed in the upper part of the copying machine, thereby forming a latent image on the photosensitive sheet 2.

The pressure developing device 8 has a pair of upper and lower pressure developing rollers 8a and 8b. The upper pressure developing roller 8a is movable vertically by means of a pressure mechanism, not shown, having an eccentric cam and a spring. The upper pressure developing roller 8a is moved downward and pressed against the lower pressure developing roller 8b, the pair of rollers thus being put in a pressing condition. The pressure developing position P2 is the point where the pair of pressure developing rollers 8a and 8b contact each other under pressure. When the upper pressure developing roller 8a is moved upward, the pressure is released on the lower pressure developing roller 8b.

The photosensitive sheet 2 passed through the pressure developing device 8 is applied on a separation roller 3 disposed adjacent to one side of the pressure developing device 8. The photosensitive sheet 2 applied on the separation roller 3 is taken up onto the takeup shaft 1b disposed diagonally upward from the separation roller 3. Therefore, the transport path of the photosensitive sheet 2 is bent diagonally upward at the separation roller 3.

On the opposite side of the copying machine from where the photosensitive sheet cartridge 1 is mounted, there are mounted paper cassettes 6a and 6b. The paper cassettes 6a and 6b respectively hold image receiving sheets 7 of different sizes or of different kinds (plain paper, overhead projector paper, etc.). To form a copy image, an image receiving sheet 7 is selectively fed into the copying machine from either one of the paper cassettes 6a or 6b, and the thus fed image receiving sheet 7 is temporarily stopped by a resist roller 13 before it is further transported to the pressure developing device 8 at a prescribed timing.

A sheet sensor S1 for sensing the transportation of the image receiving sheet 7 is disposed upstream of the resist roller 13 in the transporting direction of the image receiving sheet.

The image receiving sheet 7 is transported to the pressure developing device 8 in synchronization with the transportation of the photosensitive sheet 2 in such a way that the image receiving sheet 7 transported to the pressure developing device 8 is superimposed on the latent image area on the photosensitive sheet 2 that has been exposed to the image light. The photosensitive sheet 2 and the image receiving sheet 7, superimposed one on top the other, are passed between the pair of pressure developing rollers 8a and 8b of the pressure developing device 8 which are placed in a pressing condition. As this is happening, unhardened microcapsules on the photosensitive sheet are made to rupture, causing the coloring dyes contained therein to flow out. The coloring dyes thus caused to flow out react with the developer on the image receiving sheet 7 to develop thereon the latent image formed by the unhardened microcapsules on the photosensitive sheet 2.

The photosensitive sheet 2 and the image receiving sheets 7 that have passed the pressure developing device 8 are transported in integral fashion up to the position of the separation roller 3. Since the transport path of the photosensitive sheet 2 substantially changes its direction diagonally upward at the separation roller 3 in such a way as to move away from the image receiving sheet 7, the image receiving sheet 7 is separated from the photosensitive sheet 2 and is transported by a transport roller 9 on to a glosser unit 10.

The glosser unit 10 has a heat resisting glosser belt 10c disposed above the transport path of the image receiving sheet 7. The glosser belt 10c is applied on a heat roller 10a containing a heater such as a halogen lamp and a tension roller 10b disposed downstream of the heat roller 10a. Disposed under the heat roller 10a is a pressure roller 10d which is pressed against the heat roller 10a with the glosser belt 10c interposed therebetween. The image receiving sheet 7 on which the image has been formed by the pressure developing device 8 is heated and pressed between the heat roller 10a and the pressure roller 10d of the glosser unit 10. The image on the image receiving sheet 7 is formed with the coloring dyes, and application of heat accelerates the coloring reaction of the dyes, thereby giving clearness to the image. Also, the image receiving sheet 7 is precoated with thermoplastic resin which, when heated, softens and melts, and thus, the surface of the image receiving sheet 7 is covered with the molten resin. Pressure is applied to the molten resin which is thereby smoothed to give a glossy finish to the image. The image receiving sheet 7 passed between the heat roller 10a and the pressure roller 10b is transported on the glosser belt 10c toward the downstream side thereof. While being thus transported, the image receiving sheet 7 is gradually cooled, and after being cooled sufficiently, it is separated from the glosser belt 10c under the tension roller 10b.

On the opposite side of the copying machine from where the paper cassettes 6a and 6b are mounted, there is mounted a paper exit tray 12, onto which the image receiving sheet 7 passed through the glosser unit 10 is discharged by means of a paper exit roller 11.

Figure 3:
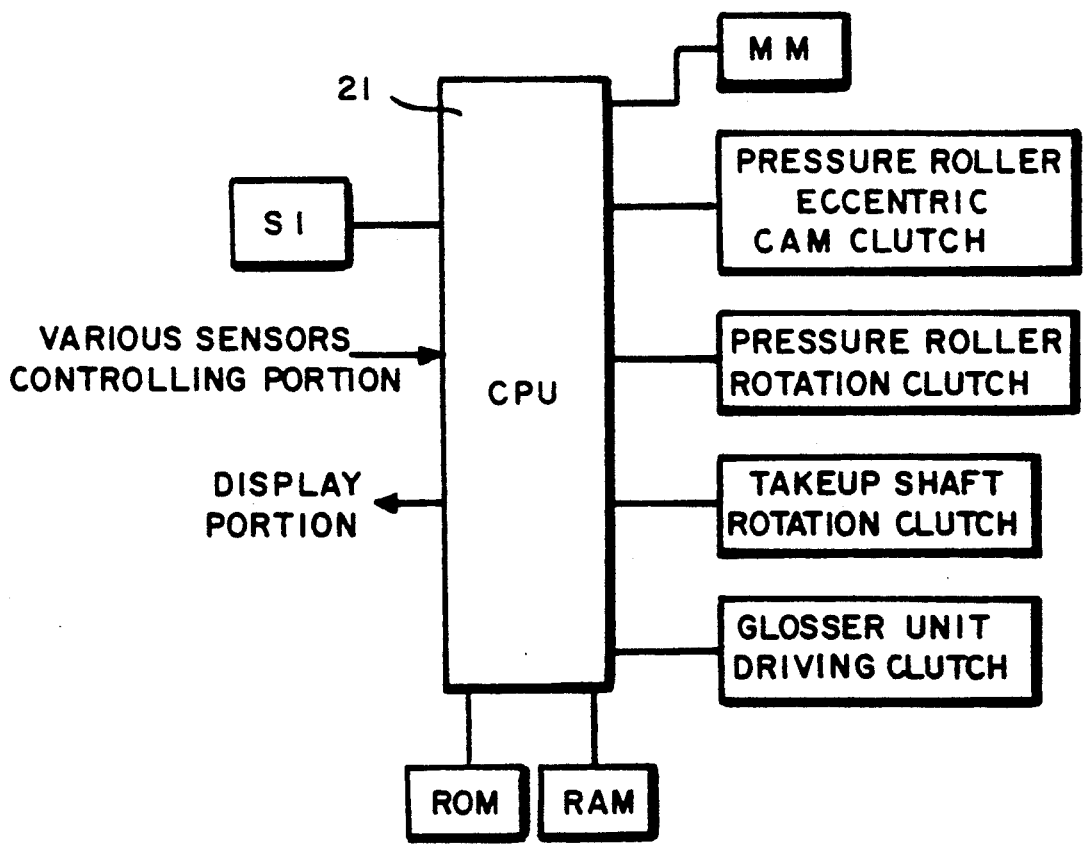
FIG. 3 is a block diagram of a control system of a copying machine equipped with the sheet transport device.

FIG. 3 is a block diagram of a control system of the above copying machine.

The entire copying machine is controlled by a CPU 21. Outputs from various sensors including the image receiving sheet sensor S1 are supplied to the CPU 21. Outputs from the CPU 21 are supplied to a main motor MM, an eccentric cam clutch 22 for moving up and down the upper pressure developing roller 8a so that pressure is applied to and released from the two pressure developing rollers 8a and 8b, a pressure roller rotation clutch 23 for transmitting torque to the lower pressure developing roller 8b, a takeup shaft rotation clutch 24 for transmitting torque to the takeup shaft 1b of the photosensitive sheet cartidge 1, a glosser unit driving clutch 25 for transmitting torque to the glosser unit 10, and so on. The clutches 22-25 are used to connect and disconnect the driving force of the main motor MM to and from the respective actuators.

When the image receiving sheet sensor S1 has detected the trailing edge of the image receiving sheet 7, the CPU 21 starts counting time using the timer. The CPU 21 is loaded with prescribed times, T1 needed for the tailing edge of the image receiving sheet 7 to reach a prescribed position before the pressure developing position P2 of the pressure developing device 8 after the image receiving sheet sensor S1 has detected the trailing edge of the image receiving sheet 7, T2 needed for the image receiving sheet 7 to stop its transportation after T1, T3 needed for the tailing edge of the image receiving sheet 7 to reach a position just before the pressure developing position P2 after T2, T4 needed for the tailing edge of the image receiving sheet 7 to pass the pressure developing position P2, and T5 needed for the tailing edge of the image receiving sheet 7 to pass the separation roller 3 after it has passed the pressure developing position P2.

Figure 1:
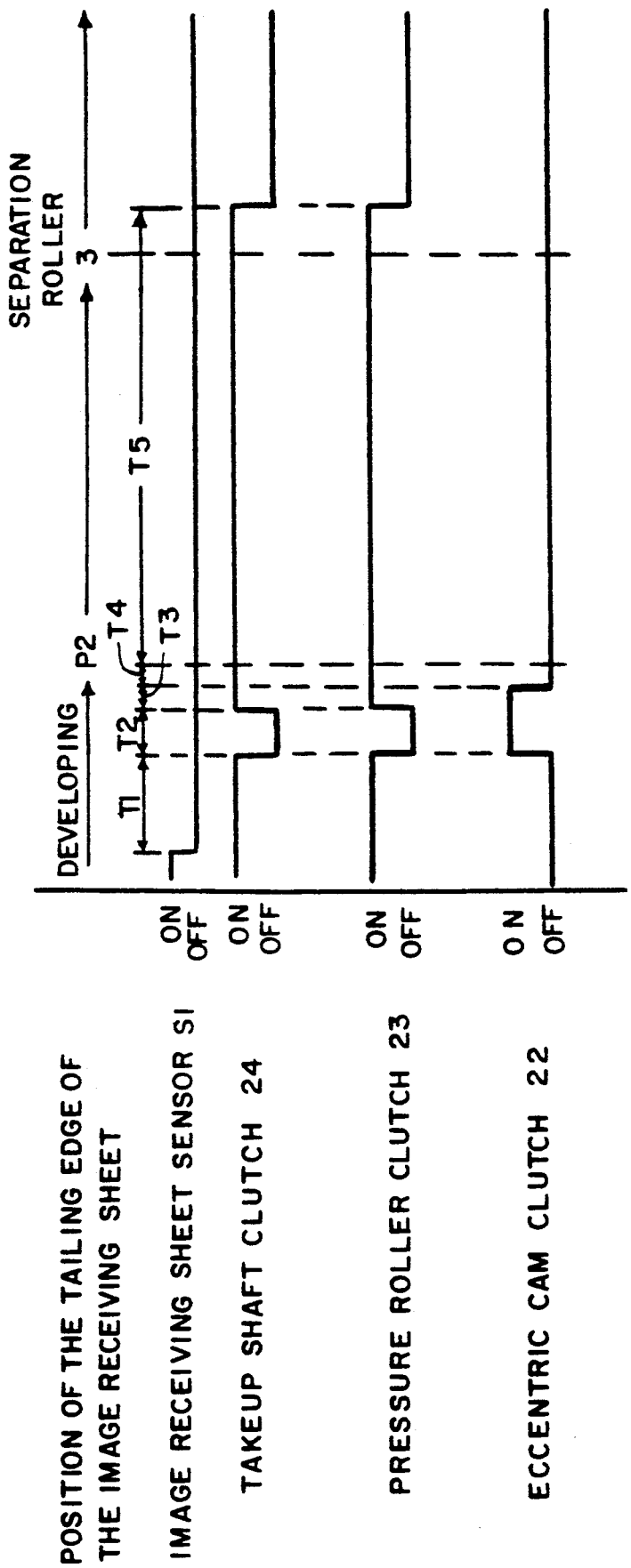
FIG. 1 is a timing chart explaining the sheet transport operation by a sheet transport device in one example according to the present invention.

FIG. 1 is a timing chart explaining the operation of the CPU 21 from the start to the end of the pressure developing process.

When the image receiving sheet sensor S1 turns from ON to OFF by detecting the trailing edge of the image receivng sheet 7, the timer starts counting the time. At the end of the prescribed time T1 before the trailing edge of the image receiving sheet 7 reaches the pressure developing position P2, the takeup shaft clutch 24 and the pressure roller clutch 23 are deactivated to stop the rotation of the takeup shaft 1b and the pressure rollers 8a and 8b, and at the same time, the eccentric cam clutch 22 is activated to release the eccentric cam pressure from the pressure rollers 8a and 8b. As a result, the transportation of the photosensitive sheet 2 and the image receiving sheet 7 is temporarily stopped while the pressure by the pressure rollers 8a and 8b is released. Thereafter, at the end of the prescribed time T2, the takeup shaft clutch 24 and the pressure roller clutch 23 are activated so that the transportation of the photosensitive sheet 2 by the takeup shaft 1b and the transporation of the photosensitive sheet 2 and the image receiving sheet 7 by the pressure rollers 8a and 8b are resumed. Then, at the end of the prescribed time T3 which is counted after the transportation of the photosensitive sheet 2 and the image receiving sheet 7 is resumed until immediately before the trailing edge of the image receiving sheet 7 reaches the pressure developing position P2, the eccentric cam clutch 22 is deactivated to put the two pressure rollers 8a and 8b in a pressing condition. When the prescribed time T4 passes after the two pressure rollers 8a and 8b have been put in a pressing condition, the trailing edge of the image receiving sheet 7 passes the pressure developing position P2.

Figure 2:
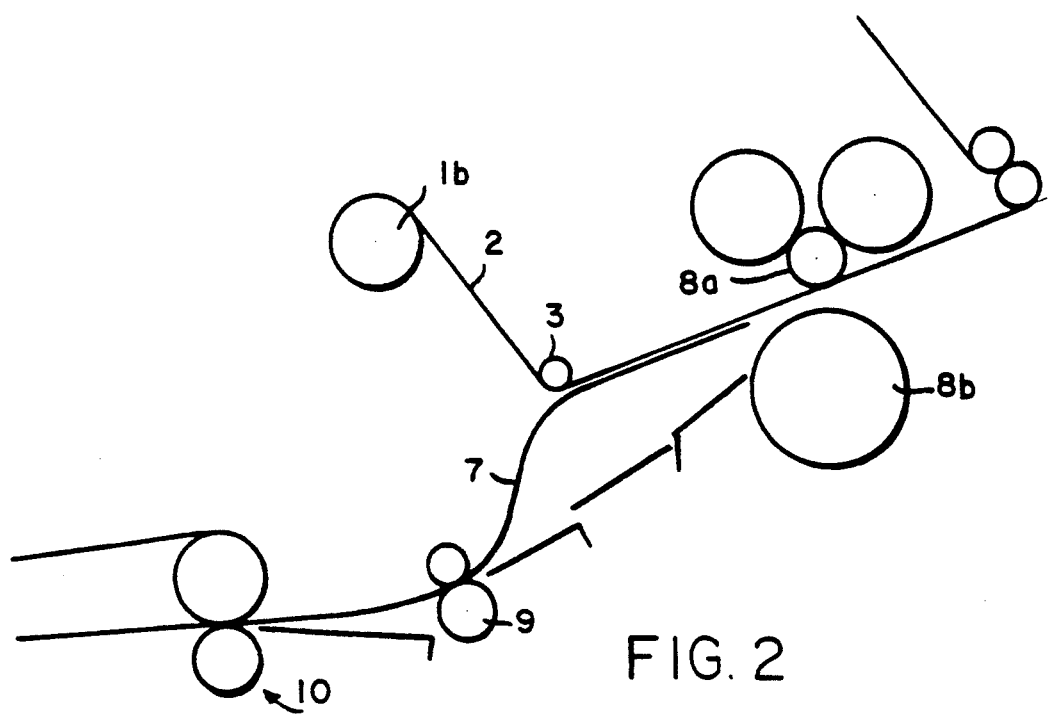
FIG. 2 is an enlarged view of a pressure developing device and its adjacent parts which are in operation for sheet transportation.

The photosensitive sheet 2 and the image receiving sheet 7 that have passed the pressure developing position P2 are transported in integral fashion as shown in FIG. 2, and since the transport path of the photosensitive sheet 2 is bent diagonally upward at the position of the separation roller 3, the image receiving sheet 7 is separated from the photosensitive sheet 2. The image receiving sheet 7 separated from the photosensitive sheet 2 is transported by the transport roller 9 on to the glosser unit 10. At this time, the takeup shaft clutch 24 and the pressure roller clutch 23 remain in an activated condition after the trailing edge of the image receiving sheet 7 has passed the pressure developing position P2. When the time T5 needed for the trailing edge of the image receiving sheet 7 to pass the separation roller 3 after passing the pressure developing position P2, the takeup shaft clutch 24 and the pressure roller clutch 23 are deactivated. Therefore, the photosensitive sheet 2 is transported together with the image receiving sheet 7 until the trailing edge of the image receiving sheet 7 reaches the separation roller 3 at which point the image receiving sheet 7 is completely separated from the photosensitive sheet 2. This eliminates the possibility of the image receiving sheet 7 dragging along the photosensitive sheet 2 during transportation, thus preventing the image formed on the image receiving sheet 7 from being damaged. Also, since the photosensitive sheet 2 and the image receiving sheet 7 are transported in integral fashion up to the position of the separation roller 3, there is no possibility of transport failure occurring due to unstable transportation of the image receiving sheet, thus assuring complete separation of the image receiving sheet 7 from the photosensitive sheet 2. Also, there is no possibility of wrinkles being formed in the image receiving sheet 7.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A sheet transport device for an image forming apparatus, comprising:

a pressure developing device for transporting a photosensitive sheet coated with light and pressure sensitive microcapsules containing photohardening materials and coloring dyes and an image receiving sheet coated with developer that reacts with the coloring dyes to develop colors, the two sheets superimposed one on top of the other for transportation, during which the two sheets are pressed together to form an image on the image receiving sheet;

a separating means for separating the image receiving sheet that has passed the pressure developing device from the photosensitive sheet;

an image receiving sheet sensor for detecting that the trailing edge of the image receiving sheet fed to the pressure developing device and to be separated from the photosensitive sheet by the separating means has passed a prescribed position; and a control means for performing control on the basis of the detection result of the image receiving sheet sensor so that the transportation of the photosensitive sheet is continued until the trailing edge of the image receiving sheet passes the separating means after passing the pressure developing device.

2. A sheet transport device according to claim 1, wherein the photosensitive sheet is taken up by a takeup means after being separated from the image receiving sheet by means of the separating means, the transportation of the photosensitive sheet by the takeup means being controlled in the same manner as for the pressure developing means.

3. A sheet transport device according to claim 1, wherein the sensor for sensing the trailing edge of the image receiving sheet is disposed forward of a resist roller provided to feed the image receiving sheet to the pressure developing device at a prescribed timing.

4. A sheet transport device according to claim 3, wherein the control means controls the pressure developing device on the basis of the time elasped after the image receiving sheet sensor has detected the trailing edge of the image receiving sheet.

5. A sheet transport device according to claim 1, wherein the separating means is a separation roller for substantially altering the transporting direction of the photosensitive sheet in such a way as to move away from the image receiving sheet.

* * * * *